United States Patent
Koutney, Jr.

(10) Patent No.: US 9,543,262 B1
(45) Date of Patent: Jan. 10, 2017

(54) SELF ALIGNED BUMP PASSIVATION

(71) Applicant: Cypress Semiconductor Corporation, San Jose, CA (US)

(72) Inventor: William W. C. Koutney, Jr., Santa Clara, CA (US)

(73) Assignee: Cypress Semiconductor Corporation, San Jose, CA (US)

(*) Notice: Subject to any disclaimer, the term of this patent is extended or adjusted under 35 U.S.C. 154(b) by 0 days.

(21) Appl. No.: 13/892,585

(22) Filed: May 13, 2013

Related U.S. Application Data

(62) Division of application No. 12/727,855, filed on Mar. 19, 2010, now abandoned.

(60) Provisional application No. 61/235,000, filed on Aug. 18, 2009.

(51) Int. Cl.
H01L 23/00 (2006.01)

(52) U.S. Cl.
CPC ................... *H01L 24/11* (2013.01)

(58) Field of Classification Search
CPC .............. H01L 24/11; H01L 2924/00014
USPC ........................... 438/612, 118, 759
See application file for complete search history.

(56) References Cited

U.S. PATENT DOCUMENTS

| | | | |
|---|---|---|---|
| 5,480,839 A * | 1/1996 | Ezawa et al. | 438/107 |
| 5,486,282 A * | 1/1996 | Datta | C25F 3/14 205/123 |
| 5,581,097 A * | 12/1996 | Nariishi | 257/208 |
| 5,910,687 A * | 6/1999 | Chen et al. | 257/784 |
| 6,291,332 B1 | 9/2001 | Yu et al. | |
| 6,322,903 B1 * | 11/2001 | Siniaguine et al. | 428/617 |
| 6,404,051 B1 | 6/2002 | Ezawa et al. | |
| 6,455,331 B2 | 9/2002 | Yu et al. | |
| 6,556,030 B1 * | 4/2003 | Akram | 324/750.05 |
| 6,590,295 B1 * | 7/2003 | Liao et al. | 257/781 |
| 6,605,524 B1 * | 8/2003 | Fan et al. | 438/613 |
| 6,608,686 B1 | 8/2003 | Lane et al. | |
| 6,686,660 B2 | 2/2004 | Nemoto | |
| 6,782,897 B2 * | 8/2004 | Wang et al. | 134/1.2 |
| 6,798,064 B1 | 9/2004 | Henry et al. | |
| 6,812,040 B2 | 11/2004 | Kyler et al. | |
| 7,008,867 B2 * | 3/2006 | Lei | H01L 24/03 257/E21.508 |
| 7,250,678 B2 | 7/2007 | Datta et al. | |
| 7,501,328 B2 | 3/2009 | Lockard et al. | |
| 7,521,805 B2 | 4/2009 | Lin et al. | |
| 7,598,097 B2 | 10/2009 | Chen et al. | |
| 8,368,212 B1 * | 2/2013 | Jergovic | H01L 23/4824 257/737 |
| 8,546,254 B2 * | 10/2013 | Lu | C25D 5/022 257/E21.479 |

(Continued)

OTHER PUBLICATIONS

Gary K. Fedder, "MEMS Fabrication," IEEE, 2003, ITC International Test Conference, Paper 27.3, pp. 691-698; 8 pages.

(Continued)

*Primary Examiner* — Jarrett Stark
*Assistant Examiner* — Charles N Ausar-El

(57) ABSTRACT

A method of fabricating multiple conductor layers utilizing the same seed layer is described. In an embodiment a stud bump structure is described in which the seed layer is encapsulated by the passivation layer. By forming the stud bump prior to the passivation layer, the height of the stud bump extending from the top surface of the passivation layer can be controlled.

18 Claims, 8 Drawing Sheets

(56) References Cited

U.S. PATENT DOCUMENTS

| | | | |
|---|---|---|---|
| 8,558,229 B2* | 10/2013 | Jeng et al. | 257/48 |
| 8,575,018 B2* | 11/2013 | Lin | H01L 23/49827 |
| | | | 257/737 |
| 8,822,323 B2* | 9/2014 | Sakamoto et al. | 438/612 |
| 8,822,324 B2* | 9/2014 | Goebel et al. | 438/612 |
| 8,951,904 B2* | 2/2015 | Lin | H01L 23/525 |
| | | | 257/773 |
| 9,437,573 B2* | 9/2016 | Masuda | H01L 24/81 |
| 2001/0040290 A1* | 11/2001 | Sakurai et al. | 257/737 |
| 2002/0017730 A1* | 2/2002 | Tahara et al. | 257/786 |
| 2002/0033531 A1 | 3/2002 | Matsushima et al. | |
| 2002/0149118 A1* | 10/2002 | Yamaguchi et al. | 257/778 |
| 2002/0185733 A1 | 12/2002 | Chow et al. | |
| 2003/0025202 A1 | 2/2003 | Mikagi et al. | |
| 2003/0080420 A1 | 5/2003 | Ohara | |
| 2003/0082906 A1* | 5/2003 | Lammert | 438/637 |
| 2003/0127734 A1 | 7/2003 | Lee et al. | |
| 2004/0188812 A1* | 9/2004 | Koschmieder et al. | 257/678 |
| 2005/0253259 A1* | 11/2005 | Lin et al. | 257/734 |
| 2005/0277283 A1* | 12/2005 | Lin et al. | 438/618 |
| 2006/0091541 A1* | 5/2006 | Bojkov et al. | 257/737 |
| 2006/0214292 A1 | 9/2006 | Agraharam et al. | |
| 2006/0246703 A1* | 11/2006 | Daubenspeck et al. | 438/612 |
| 2007/0026631 A1* | 2/2007 | Lin et al. | 438/424 |
| 2007/0087544 A1* | 4/2007 | Chang et al. | 438/612 |
| 2007/0121606 A1* | 5/2007 | Scheinert | H04M 1/2535 |
| | | | 370/356 |
| 2007/0184578 A1* | 8/2007 | Lin | H05K 3/3452 |
| | | | 438/106 |
| 2008/0054461 A1* | 3/2008 | Lang et al. | 257/738 |
| 2008/0080113 A1* | 4/2008 | Lin et al. | 361/56 |
| 2008/0153281 A1* | 6/2008 | Knollenberg et al. | 438/612 |
| 2008/0157362 A1* | 7/2008 | Chang et al. | 257/738 |
| 2008/0169562 A1 | 7/2008 | Ke et al. | |
| 2008/0296761 A1* | 12/2008 | Lee et al. | 257/737 |
| 2009/0243047 A1 | 10/2009 | Wolter | |
| 2010/0052159 A1* | 3/2010 | Hwang | 257/737 |
| 2010/0140752 A1* | 6/2010 | Marimuthu et al. | 257/621 |
| 2015/0303168 A1* | 10/2015 | Jin | H01L 24/83 |
| | | | 438/118 |
| 2016/0035684 A1* | 2/2016 | Wei | H01L 24/13 |
| | | | 257/737 |

OTHER PUBLICATIONS

Narayanan S. Partangel, Master's Thesis: The Relationship Between Process and Manufacturing Plant Performance: a Goal Programming Data Envelopement Analysis Approach, Chapter 5, "Overview of the Manufacturing Process," Sep. 1999, pp. 47-56; 10 pages.

USPTO Advisory Action for U.S. Appl. No. 12/727,855 dated Apr. 19, 2013; 3 pages.

USPTO Final Rejection for U.S. Appl. No. 12/727,855 dated Feb. 14, 2013; 13 pages.

USPTO Non-Final Rejection for U.S. Appl. No. 12/727,855 dated Sep. 10, 2012; 9 pages.

USPTO Requirement for Restriction for U.S. Appl. No. 12/727,855 dated Jun. 6, 2012; 8 pages.

USPTO Requirement for Restriction for U.S. Appl. No. 12/727,855 dated Jul. 27, 2012; 8 pages.

* cited by examiner

SELF ALIGNED BUMP PASSIVATION

RELATED APPLICATIONS

This application is a divisional of U.S. application Ser. No. 12/727,855, filed on Mar. 19, 2010, which claims the benefit of U.S. Provisional Patent Application Ser. No. 61/235,000, filed Aug. 18, 2009, both of which applications are hereby incorporated by reference in their entirety.

TECHNICAL FIELD

Embodiments of the present invention relate to the field of microelectronic packaging, and more particularly to the formation of stud bumps.

BACKGROUND

Packaging of chips is an important step in microelectronic fabrication, contributing to the overall cost, performance and reliability of a packaged chip. Some chip boding technologies utilize a copper bump formed on a chip to connect the chip to a package or PC board. For example, a copper bump may be utilized in wafer-level chip-scale packaging (WLCSP) technologies such as flip-chip. In a conventional manufacturing sequence, the chip passivation layer is formed prior to creation of the copper bump.

DETAILED DESCRIPTION

In the following description, numerous specific details are set forth, such as specific configurations, compositions, and processes, etc., in order to provide a thorough understanding of the present invention. In other instances, well-known processes and manufacturing techniques have not been described in particular detail in order to not unnecessarily obscure the present invention. Furthermore, it is to be understood that the various embodiments shown in the Figures are illustrative representations and are not necessarily drawn to scale.

The terms "above," "over," "between," and "on" as used herein refer to a relative position of one layer with respect to other layers. One layer deposited or disposed above or under another layer may be directly in contact with the other layer or may have one or more intervening layers. One layer deposited or disposed between layers may be directly in contact with the layers or may have one or more intervening layers. In contrast, a first layer "on" a second layer is in contact with that second layer.

Figure 1A:
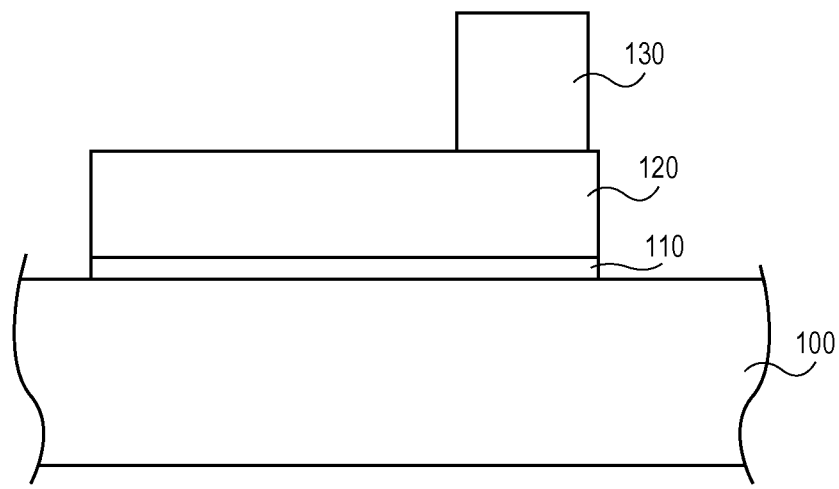
FIGS. 1A-1B illustrate the formation of multiple conductor layers on a substrate, in accordance with an embodiment of the present invention.
Figure 1B:
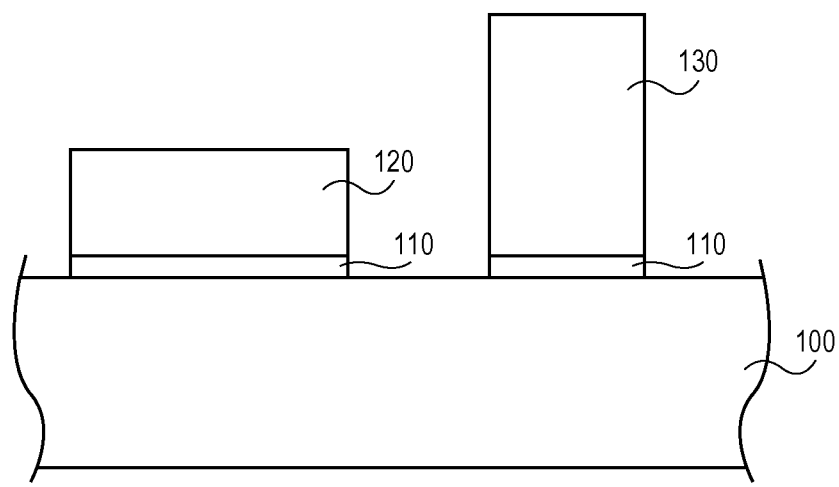

In accordance with some embodiments, a method of forming multiple conductor layers is disclosed. In an embodiment, a seed layer is blanket deposited on a substrate. A first photoresist layer is formed on the substrate, and patterned to create a first opening. A first metal layer may then be electroplated into the first opening. The first photoresist layer is then removed, and the seed layer remains on the substrate. A second photoresist layer is then formed on the substrate, and patterned to create a second opening. A second metal layer may then be electroplated into the second opening. The second photoresist layer is then removed, and the exposed portions of the seed layer not underlying the first and/or second metal layers may then be removed from the substrate. Referring to FIG. 1A, the first and second openings can overlap to form a multi-layer metal stack including a second metal layer 130 having a second thickness overlapping a first metal layer 120 having a first thickness, formed over a seed layer 110 which is formed on a substrate 100. While FIG. 1A illustrates the second metal layer 130 formed directly over, and completely overlapping the first metal layer 120, it is also possible to have the second metal layer 130 'straddle' the first metal layer 120, i.e. have part of the second metal layer 130 on the first metal layer 120 and part of the second metal layer 130 on the seed layer 110. Referring to FIG. 1B, the first and second openings do not overlap, and the second metal layer 130 and first metal layer 120 do not overlap. In an embodiment, the metal layers 120, 130 may have substantially straight sidewalls. The first and second metal layers 120, 130 illustrated in FIGS. 1A-1B may have any suitable thickness. The second metal layer 130 may be thicker than the first metal layer 120, vice versa, or they may have the same thickness. In an embodiment, the thickness of each layer 120, 130 is at least approximately one micron. In accordance with some embodiments, the original blanket deposited seed layer is utilized in multiple electroplating operations for the formation of multiple metal layers, which may or may not overlap. The seed layer is deposited only once, then the sequence of pattern, plate, strip resist is repeated once per metal thickness required. Then the seed layer is stripped once only, saving multiple seed layer strips and seed layer depositions.

In accordance with some embodiments, a stud bump structure and method of forming a stud bump structure is disclosed. Referring to FIGS. 2J-2J' a stud bump structure is disclosed in which sidewalls of a seed layer are encapsulated by a passivation layer. The structure comprises a seed layer 210 formed on a substrate 200, and a stud bump 230 formed over the seed layer 210. A passivation layer 240, which may comprise benzocyclobutene (BCB) or polyimide, for example, is disposed over the substrate 200 and encapsulates seed layer 210. As illustrated in FIGS. 2J-2J', sidewalls of seed layer 210 are in contact with passivation layer 240. A redistribution layer 220 may be formed between the seed layer 210 and stud bump 230, as illustrated in FIGS. 2J-2J'. Referring to FIG. 2K a stud bump structure is disclosed in which a stud bump 230 is formed on the seed layer 210 without an intervening redistribution layer.

Stud bump 230 may be formed directly on redistribution layer 220 such that no seed layer is present between redistribution layer 22 and stud bump 230. Redistribution layer 220 may also be encapsulated by passivation layer 240. As illustrated in FIGS. 2J-2J' passivation layer 240 may contact only a portion of the sidewalls of stud bump 230. The height "H" of the top surface of stud bump 230 extending above the top surface of the passivation layer 240 may be tailored to meet customer requirements. In an embodiment, the height "H" is approximately 50-200 microns.

In a conventional manufacturing sequence, a chip passivation layer is formed prior to creation of the copper bump. For example, a conventional sequence may form the passivation layer on the chip substrate, open a hole through the passivation layer (mask required), deposit a seed layer, pattern a resist on the seed layer (mask required), plate a copper stud bump, and then strip the resist and seed layer from the chip substrate. A first mask is required to open the hole through the passivation layer, and a second mask is required to pattern the seed layer. Conventional tools utilized in manufacturing facilities, such as a projection aligner, stepper, or direct write tool may have overlay tolerances in the range of 3-10 microns.

In accordance with one aspect, embodiments of the present invention can save up to 20 microns in overlay tolerance at the manufacturing facilities by forming a self-aligned stud bump which requires one patterning (e.g. reticle or direct write) operation to form the stud bump. This may result is less control being required over the process, resulting in a lower number of control measurements required and less downtime. In order to reduce the number of pattering operations to form the stud bump, the stud bump is formed prior to forming the passivation layer.

Forming the stud bump prior to forming the passivation layer may also provide several additional benefits. In a conventional manufacturing sequence, a chip passivation layer is formed prior to creation of the copper bump. Typically passivation layers including benzocyclobutene (BCB) or polyimide based dielectrics such as the HD-8800 series, HD-4100 and PI-2525 (available from HD Microsystems of Parlin, N.J. USA) are spun onto the chip. However, the thickness of the spun on passivation layer above the highest features on the substrate is typically only achievable up to about 5-10 microns. As a result, the copper bump which is formed extends considerably above the surface of the spun on passivation layer. For example, when the opening in the passivation layer has a width of approximately 200 microns, assuming a spherical or oblong gold bump, the gold bump may extend almost 200 microns from the surface of the passivation layer. In accordance with some embodiments of the present invention, the passivation layer can be spun on, or otherwise applied, after the formation of the stud bump and etched back to the desired distance from the top surface of the stud bump. This may provide flexibility for implementing the chip substrate onto a package or PCB system where the total thickness of the system is thin. Additionally, the passivation layer may protect the sidewalls of the stud bump against oxidation and moisture, and provide mechanical reinforcement from shear forces.

Another advantage is that the passivation layer may encapsulate sidewalls of the stud bump seed layer. In a conventional manufacturing sequence, the seed layer sidewalls and bump sidewalls extending from the top surface of the passivation layer are exposed. Where the seed layer and/or bump are composed of one or more different metal layers, exposure to moisture can cause corrosion, etching and delamination between layers. In accordance with some embodiments of the present invention, the seed layer sidewalls are encapsulated by the passivation layer, thereby protecting the stud bump from the environment.

Figure 2A:
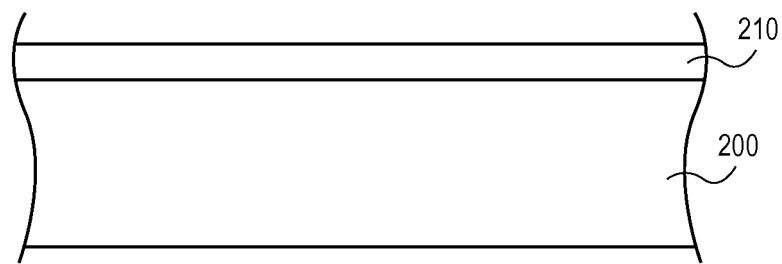
FIGS. 2A-2J' illustrate the formation of a stud bump, in accordance with an embodiment of the present invention.

Referring to FIG. 2A, in an embodiment, the process begins with blanket depositing a seed layer 210 on a substrate 200. Seed layer 210 may be deposited utilizing a vacuum sputtering operation, for example. Seed layer 210 may be a single layer, or be composed of multiple layers. For example, the seed layer can be a Ti/Cu, Ni/Cu, or TiW/Cu, etc. including a lower layer of Ti, Ni or TiW and an upper Cu layer. Seed layer can include more than two layers. For example, seed layer can include three layers Al/Ti/Cu or Ni/Cr/Cu. In an embodiment, each individual layer in the seed layer 210 may be approximately 1,000-2,000 angstroms thick.

Figure 2B:
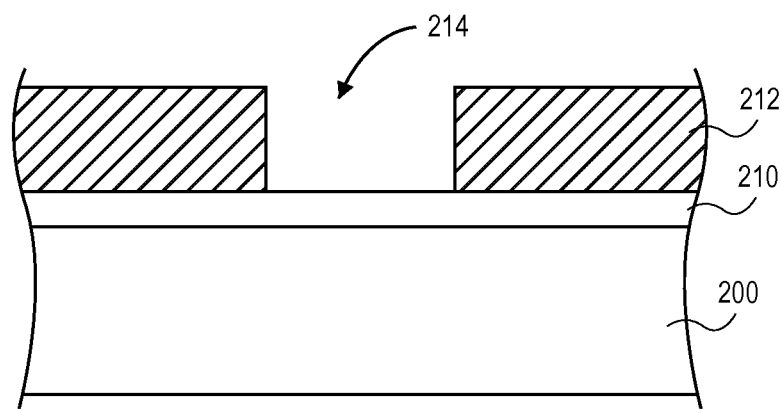
Figure 2C:
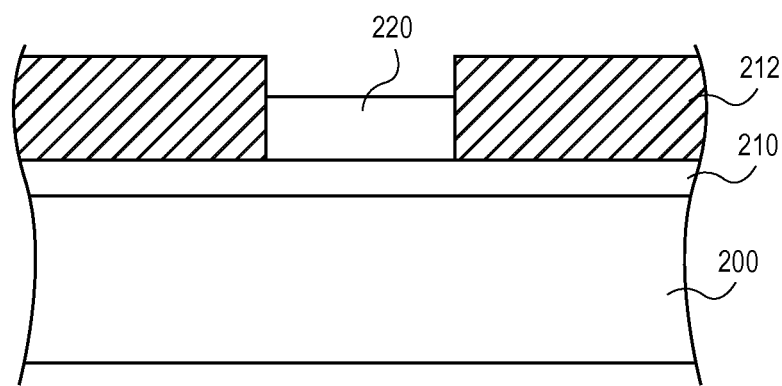

Referring to FIG. 2B, a first photoresist layer 212 is then formed over the substrate 200, and patterned to form a first opening 214 in the substrate. In an embodiment, the first photoresist layer 212 has a thickness greater than the height (thickness) of the completed redistribution layer. For example, the first photoresist layer may have a thickness of approximately 15 microns. Referring to FIG. 2C, a redistribution layer 220 is then formed in the first opening 214. In an embodiment, redistribution layer 220 is formed by electroplating. In an embodiment, redistribution layer 220 is greater than 1 micron thick. For example, redistribution layer may be 5-10 microns thick. In an embodiment, redistribution layer is copper, though other materials such as, but not limited to, aluminum may also be utilized.

Figure 2D:
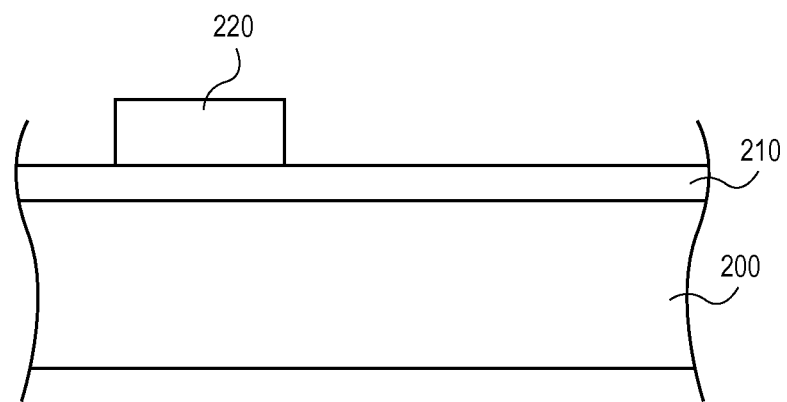
Figure 2D:
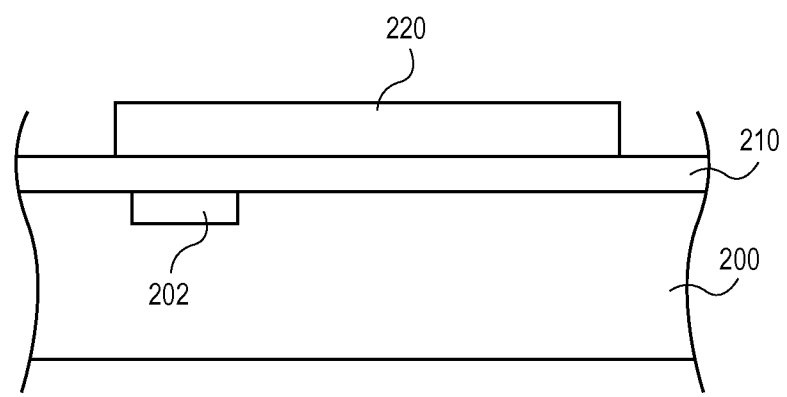

Referring to FIG. 2D, the first photoresist layer 212 is then removed from the substrate. A basic photoresist removal solution such as a sodium carbonate based, or potassium hydroxide based solution may be used in order to remove the photoresist layer 212 without attacking the exposed portion of seed layer 210, which remains on the substrate 200. FIG. 2D' is a side view illustration of FIG. 2D in a direction orthogonal to the page illustrating a length of redistribution layer 220 in accordance with an embodiment of the invention. As illustrated in FIG. 2D' redistribution layer 220 may be in electrical contact with pad 202.

Figure 2E:
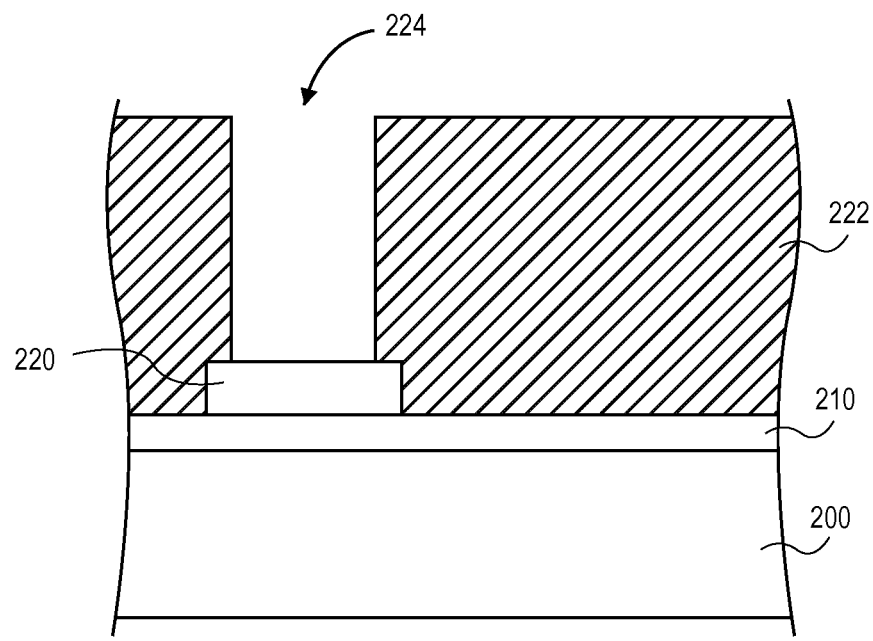
Figure 2F:
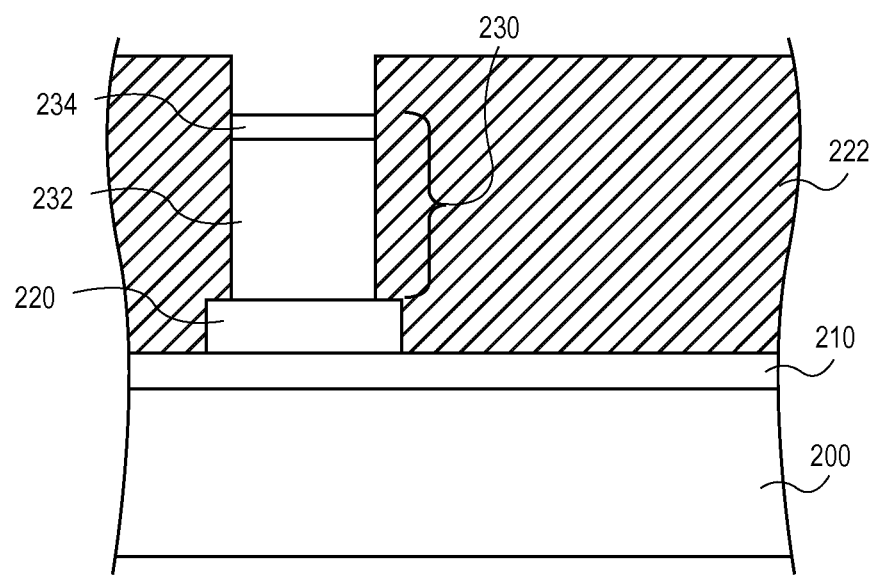

Referring to FIG. 2E, a second photoresist layer 222 is formed over the substrate 200, and patterned to form opening 224 exposing a portion of redistribution layer 220. In an embodiment, the second photoresist layer 222 has a thickness greater than the height (thickness) of the final stud bump 230. For example, the second photoresist layer 222 may have a thickness of approximately 250 microns. Referring to FIG. 2F, a stud bump 230 is then formed in the second opening 224. In an embodiment, stud bump 230 is formed by electroplating. Stud bump 230 may be electroplated directly on redistribution layer 220, without forming a seed layer between redistribution layer 22 and stud bump 230.

In an embodiment, stud bump 230 is 50-200 microns high (thick), though the height can be varied according to application. In an embodiment, stud bump 230 is comprised of a bulk metal layer 232 and a cap layer 234. In an embodiment, bulk metal layer 232 is copper, and cap layer 234 is tin or tin alloy. Stud bump 230 may be formed by immersing the substrate in a copper electroplating bath to form bulk metal layer 232, and then immersing the substrate into a tin or tin alloy electroplating bath to form cap layer 234. In an embodiment, cap layer 234 comprises 4-40 microns of the stud bump 230 height (thickness). In accordance with embodiments of the invention, the shape stud bump 230 is determined by the shape of the second opening 224 in the second photoresist layer 222. In an embodiment, stud bump 230 has substantially straight sidewalls.

Figure 2G:
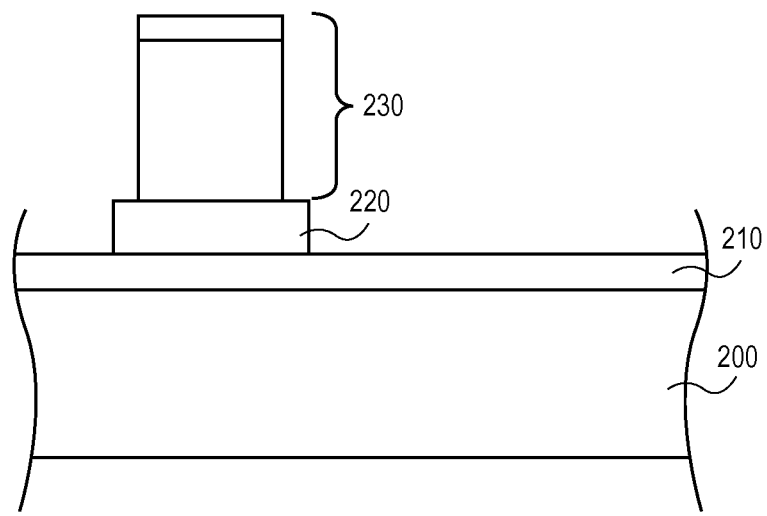
Figure 2G:
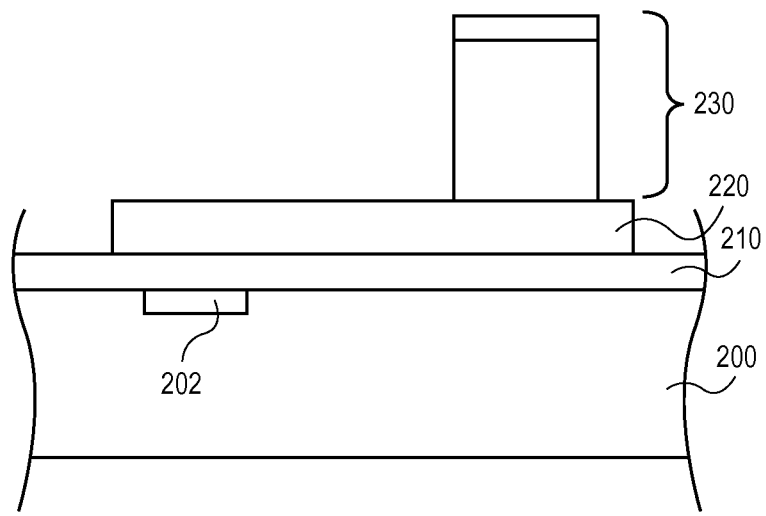

Referring to FIG. 2G, the second photoresist layer 222 is then removed from the substrate. A basic photoresist removal solution such as a sodium carbonate based, or potassium hydroxide based solution may be used in order to remove the photoresist layer 222 without attacking seed layer 210, which remains on the substrate 200. FIG. 2G' is a side view illustration of FIG. 2G in a direction orthogonal to the page illustrating a length of redistribution layer 220 in accordance with an embodiment of the invention. As illustrated in FIG. 2G' redistribution layer 220 may be in electrical contact with pad 202 at a location that is not directly underneath stud bump 230.

Figure 2H:
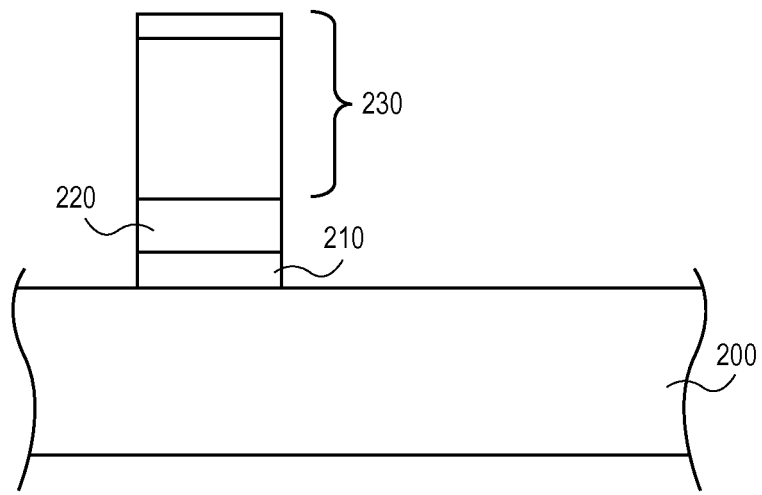

Referring to FIG. 2H, the exposed portions of seed layer 210 are then removed from substrate 200 utilizing a suitable solution. For example, sulfuric acid and hydrogen peroxide may be utilized to remove copper. Hydrogen peroxide may be used to remove TiW. Hydrogen peroxide and ammonium hydroxide may be used to remove titanium. Potassium hydroxide may be used to remove aluminum. Other suitable removal solutions may also be utilized as appropriate.

Figure 2I:
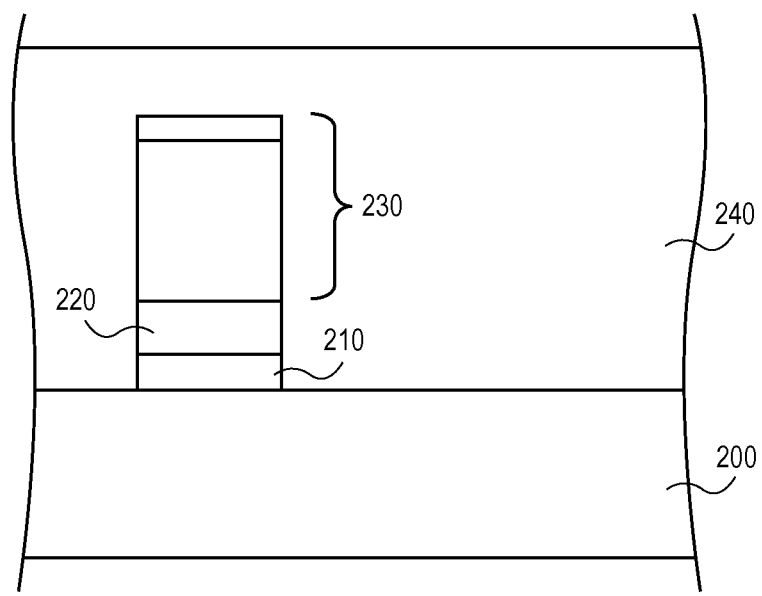
Figure 2J:
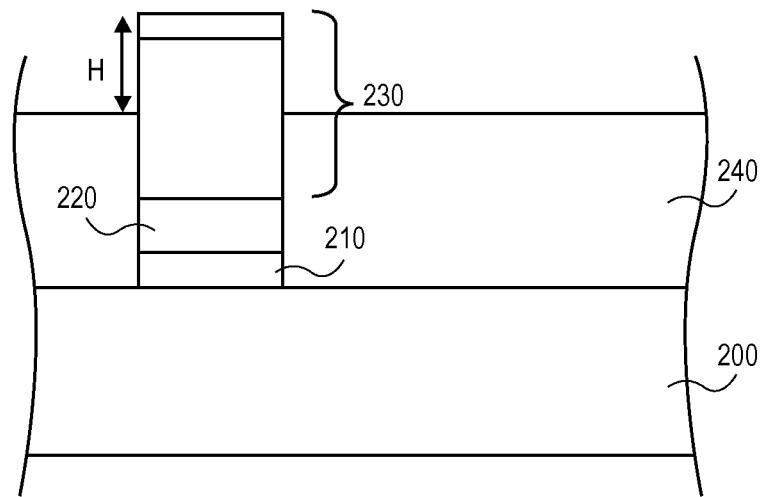
Figure 2J:
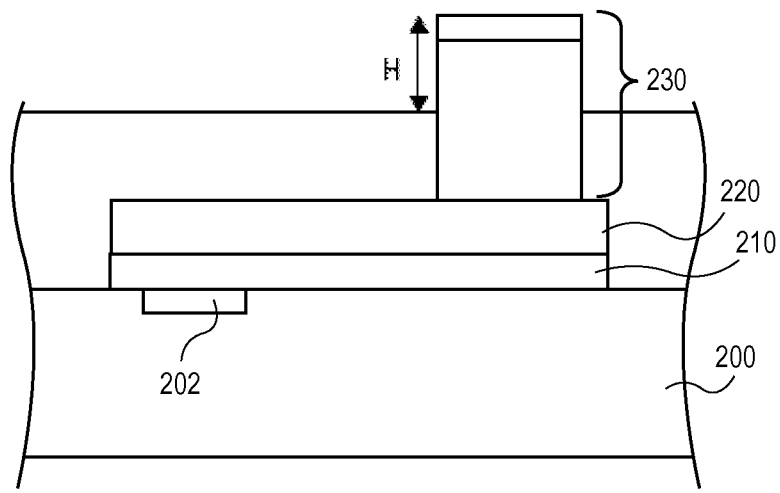
Figure 2K:
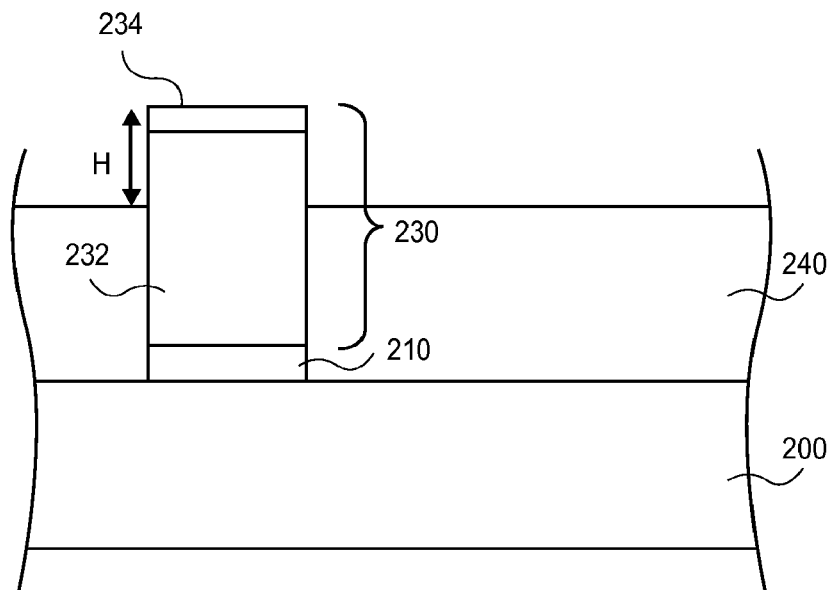
FIG. 2K illustrates the formation of a stud bump, in accordance with an embodiment of the present invention.

Referring to FIG. 2I, passivation layer 240 is then applied over substrate 200 and stud bump 230. In an embodiment passivation layer 240 comprises benzocyclobutene (BCB) or polyimide. For example, passivation 240 may be formed from the HD-8800 series, HD-4100 and PI-2525 (available from HD Microsystems of Parlin, N.J. USA). Passivation layer 240 may be applied by, for example, spin coating screen printing, roll coating, etc. In an embodiment, passivation layer 240 is then cured. In another embodiment, passivation layer is not cured until after the etch-back operation discussed with regard to FIG. 2J.

Referring to FIG. 2J, the top surface of passivation layer 240 is etched back to expose the top surface of stud bump 230. The amount of etch-back may be dependent upon specific customer requirements. In an embodiment, the top surface of passivation layer 240 is etched back to expose approximately 50-200 microns height "H" of stud bump 230. In an embodiment, passivation layer 240 is cured after the etch-back operation. In an embodiment, the etch-back operation is performed by plasma etching. For example, this may be accomplished in an oxygen plasma. In an embodiment, the etch-back operation may be performed by ablation. For example, this may be accomplished with a laser in the 248-365 nm range. In another, embodiment the etch-back operation can be accomplished with a photosensitive polyimide, in which a limited exposure is utilized to etch-back the desired amount of photosensitive polyimide.

FIG. 2J' is a side view illustration of FIG. 2J in a direction orthogonal to the page illustrating a length of redistribution layer 220 in accordance with an embodiment of the invention. As illustrated in FIG. 2J' redistribution layer 220 may be in electrical contact with pad 202 at a location that is not directly underneath stud bump 230.

Figure 2L:
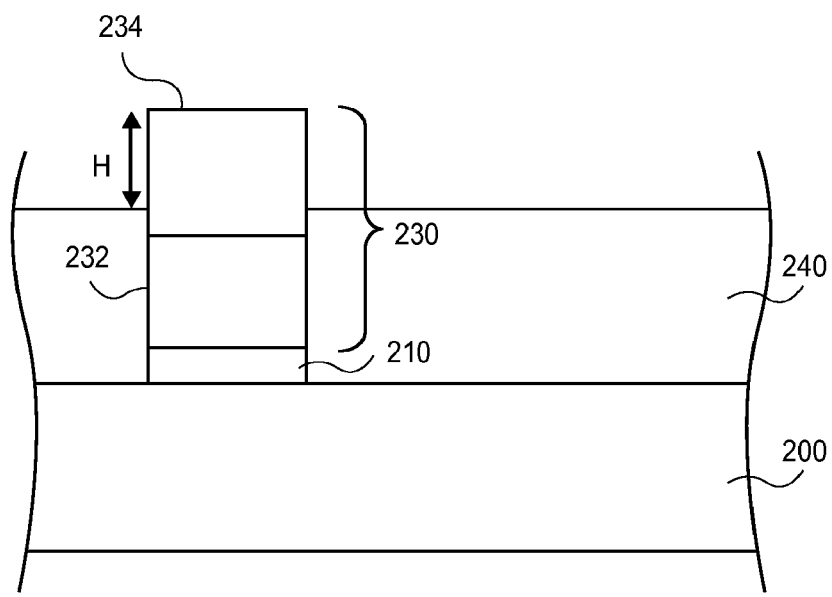
FIG. 2L illustrates the formation of a stud bump, in accordance with an embodiment of the present invention.

While FIGS. 2J-2J' and FIG. 2K illustrate that the etch-back operation partially exposes the sidewalls of bulk metal layer 232, it is to be appreciated that the thickness of optional cap layer 234 in stud bump 230 can be adjusted, as can the amount of etch-back of passivation layer 240. For example, as illustrated in FIG. 2L, the thickness of cap layer 234 and/or the amount of etch-back of passivation layer 240 can be adjusted such that the interface between cap layer 234 and bulk metal layer 232 is below a top surface of passivation layer 240, and the sidewalls of bulk metal layer 232 are encapsulated by passivation layer 240.

In the foregoing specification, various embodiments of the invention have been described for forming multiple conductor layers on a substrate. In an embodiment, a structure and method of fabricating a stud bump have been described. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:
1. A method comprising:
blanket depositing a seed layer on a surface of a substrate;
forming a first photoresist layer over the substrate and patterning a first opening in the first photoresist layer exposing a portion of the seed layer;
electroplating a redistribution layer on the portion of the seed layer exposed in the first opening;
removing the first photoresist layer using a sodium carbonate or potassium hydroxide based solution;
forming a second photoresist layer over the substrate and patterning a second opening in the second photoresist layer exposing a portion of the redistribution layer;
forming a self-aligned stud bump by sequentially electroplating a bulk metal layer on the portion of the redistribution layer exposed in the second opening and a cap layer on the bulk metal layer to form a completed stud bump in the opening without forming an additional photoresist layer;
removing the second photoresist layer from the substrate to expose a portion of the seed layer using a sodium carbonate or potassium hydroxide based solution;
removing the exposed portion of the seed layer;
screen printing a passivation layer over the substrate, seed layer, redistribution layer and the completed stud bump; and
etching back the passivation layer to expose a portion of the cap layer, so that a top surface of the stud bump is above a top surface of the passivation layer, and the seed layer, the redistribution layer, the bulk metal layer and at least a portion of sidewalls of the cap layer are encapsulated by the passivation layer.

2. The method of claim 1, wherein forming the passivation layer comprises forming the passivation layer without the use of a mask to form an opening for the completed stud bump.

3. The method of claim 1, wherein etching back the passivation layer comprises ablating the passivation layer.

4. The method of claim 3, wherein ablating the passivation layer comprises laser ablation.

5. The method of claim 1, wherein the passivation layer comprises photosensitive polyimide, and etching back the passivation layer the passivation layer comprises a limited exposure of the photosensitive polyimide.

6. A method comprising:
sequentially blanket depositing a seed layer directly on a planar surface of a substrate;
forming a photoresist layer over the seed layer;
forming an opening in the photoresist layer;
forming a self-aligned stud bump by sequentially electroplating a bulk metal layer and a cap layer in the opening in the photoresist layer without forming an additional photoresist layer;
removing the photoresist layer from the substrate using a sodium carbonate or potassium hydroxide based solution to expose a portion of the seed layer;
removing the exposed portion of the seed layer;
roll coating a passivation layer comprising photosensitive polyimide on the substrate and over the stud bump; and
etching back the passivation layer to expose a top surface of the stud bump, wherein etching back the passivation layer comprises a limited exposure of the photosensitive polyimide to remove a portion of a top surface of the passivation layer to expose the top surface of the stud bump without the use of a mask.

7. The method of claim 6, wherein etching back the passivation layer comprises etching back the passivation layer so that an interface between the seed layer and the stud bump are encapsulated by the passivation layer.

8. A method comprising:
blanket depositing a seed layer on a substrate;

forming a mask by depositing a photoresist layer over the seed layer and forming an opening in the photoresist layer;

forming a self-aligned stud bump by sequentially electroplating a bulk metal layer and a cap layer in the opening without forming an additional mask;

removing the photoresist layer to expose a portion of the seed layer using a sodium carbonate or potassium hydroxide based solution;

applying a passivation layer over the substrate and stud bump;

etching back the passivation layer to expose a portion of the stud bump; and curing the passivation layer after etching back the passivation layer, wherein after etching back the passivation layer encapsulates the seed layer, bulk metal layer and at least a portion of sidewalls of the cap layer.

9. The method of claim 8, wherein etching back the passivation layer comprises ablating the passivation layer.

10. The method of claim 9, wherein ablating the passivation layer comprises laser ablation.

11. The method of claim 10, wherein ablating the passivation layer comprises laser ablation using a laser operating in the 248-365 nanometer (nm) range.

12. The method of claim 8, wherein etching back the passivation layer comprises plasma etching in oxygen plasma.

13. The method of claim 8, wherein the passivation layer comprises photosensitive polyimide and etching back the passivation layer the passivation layer comprises a limited exposure of the photosensitive polyimide.

14. The method of claim 8, wherein the multi-layer seed layer comprises a Ti/Cu, Ni/Cu, TiW/Cu, Al/Ti/Cu or Ni/Cr/Cu multi-layer seed layer.

15. The method of claim 8, wherein the multi-layer seed layer comprises an Al/Ti/Cu or a Ni/Cr/Cu multi-layer seed layer.

16. The method of claim 8, wherein the bulk metal layer comprises copper, and the cap layer comprises tin or a tin alloy.

17. The method of claim 8, wherein applying a passivation layer over the substrate and stud bump comprises screen printing a passivation layer over the substrate and stud bump.

18. The method of claim 8, wherein applying a passivation layer over the substrate and stud bump comprises roll coating a passivation layer over the substrate and stud bump.

* * * * *